United States Patent
Sakuma (10) Patent No.: US 6,506,253 B2
(45) Date of Patent: Jan. 14, 2003

(54) PHOTO-EXCITED GAS PROCESSING APPARATUS FOR SEMICONDUCTOR PROCESS

(75) Inventor: Takeshi Sakuma, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/948,577

(22) Filed: Sep. 10, 2001

(65) Prior Publication Data

US 2002/0035962 A1 Mar. 28, 2002

(30) Foreign Application Priority Data

Sep. 22, 2000 (JP) ........................................ 2000-289499

(51) Int. Cl.$^7$ ................................................ B05C 5/00
(52) U.S. Cl. ........................ 118/620; 118/719; 118/715
(58) Field of Search ................................ 118/715, 719, 118/725, 500, 724, 729, 728, 720, 730, 620; 216/67, 59, 63, 68; 219/411, 405; 204/192.15, 298.08, 298.09, 298.15, 298.2, 298.31, 298.37, 298.38; 156/345.29, 345.33, 345.36, 345.37, 345.43, 345.49, 345.51

(56) References Cited

U.S. PATENT DOCUMENTS

| 4,511,788 | A | * | 4/1985 | Arai et al. .................... 219/411 |
|---|---|---|---|---|
| 4,699,689 | A | * | 10/1987 | Bersin ..................... 204/192.32 |
| 4,836,140 | A | * | 6/1989 | Koji ........................... 118/50.1 |
| 4,895,107 | A | * | 1/1990 | Yano et al. .................. 118/719 |
| 5,207,835 | A | * | 5/1993 | Moore ......................... 118/724 |
| 5,288,684 | A | * | 2/1994 | Yamazaki et al. ........... 118/719 |
| 5,383,984 | A | * | 1/1995 | Shimada et al. ....... 118/723 ER |
| 5,616,208 | A | * | 4/1997 | Lee .............................. 118/715 |
| 5,651,670 | A | * | 7/1997 | Okase et al. .................. 432/11 |
| 5,785,796 | A | * | 7/1998 | Lee .............................. 118/715 |
| 5,803,975 | A | * | 9/1998 | Suzuki ................ 118/723 MA |
| 5,810,930 | A | * | 9/1998 | Eom et al. .................... 118/715 |
| 6,022,413 | A | * | 2/2000 | Shinozaki et al ............ 118/725 |
| 6,029,602 | A | * | 2/2000 | Bhatnagar ............. 118/723 MR |
| 6,071,572 | A | * | 6/2000 | Mosely et al. ......... 118/723 ER |
| 6,111,225 | A | * | 8/2000 | Ohkase et al. ............... 118/724 |
| 6,143,081 | A | * | 11/2000 | Shinriki et al. .............. 118/715 |
| 6,284,050 | B1 | * | 9/2001 | Shi et al. ..................... 118/720 |
| 6,287,643 | B1 | * | 9/2001 | Powell et al. ......... 118/723 ME |
| 6,399,922 | B2 | * | 6/2002 | Okase et al. ................. 118/724 |

FOREIGN PATENT DOCUMENTS

| JP | 359129770 A | * | 7/1984 | ........... C23C/11/00 |
|---|---|---|---|---|
| JP | 359193130 A | * | 11/1984 | ............ B01J/19/00 |
| JP | 61-183921 | | 8/1986 | |
| JP | 04163911 | * | 10/1990 | ......... H01L/21/205 |
| JP | 6-216041 | | 8/1994 | |
| JP | 62-190833 | * | 8/1997 | ......... H01L/21/205 |

OTHER PUBLICATIONS

"Preparation of TiB2 films by photochemical vapor deposition using a D2 Lamp", Seiji Motojima, et al, Appl.Phys.Lett. (56) 10, Mar. 1990, Abstract.*

"Photochemical formation of silver metal films from silver salt of natural high molecular carboxylic acid", Yonezawa et al, J.App.Phys. (68) 3, Aug. 1990, Abstract.*

* cited by examiner

Primary Examiner—Gregory Mills
Assistant Examiner—Rudy Zervigon
(74) Attorney, Agent, or Firm—Oblon, Spivak, McClelland, Maier & Neustadt, P.C.

(57) ABSTRACT

A CVD apparatus includes a process chamber connected to a process chamber through a connection path. A window made of a light transmission material is disposed in a wall that defines the excitation chamber. A light source is disposed outside the excitation chamber to face the window. The light source irradiates a flow of a process gas with light through the window, thereby exciting the process gas. A surface purge system is arranged to supply a purge gas along the inner surface of the window. The surface purge system has a purge gas port open to the excitation chamber.

20 Claims, 6 Drawing Sheets

FIG. 6

PHOTO-EXCITED GAS PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 2000-289499, filed Sep. 22, 2000, the entire contents of which are incorporated herein by reference.

BACKGROUND OF THE INVENTION

1. Field of the Invention

The present invention relates to a photo-excited gas processing apparatus for a semiconductor process which subjects a target substrate to a process such as CVD (Chemical Vapor Deposition) by using a process gas excited by light. The semiconductor process refers to various types of processes performed to form a semiconductor layer, insulating layer, conductive layer, and the like on a target substrate such as a semiconductor wafer or LCD substrate with a predetermined pattern, so that a semiconductor device or a structure including an interconnection, electrode, and the like to be connected to the semiconductor device is manufactured on the target substrate.

2. Description of the Related Art

In the manufacture of a semiconductor device, a target substrate, e.g., a semiconductor wafer, is subjected to various types of processes such as annealing, film formation, etching, oxidation, and diffusion. Of these processes, the specification (design rule) for the film formation technique is becoming more and more strict each year. This is because the semiconductor device is becoming higher in density and integration and the film to be formed is becoming thinner with a higher quality. Under these circumstances, photo-assisted CVD using an optical energy has been attracting attention.

When photo-assisted CVD is compared to plasma CVD, it can form a film less damaged by ions, can form a better amorphous film, and can form a film at a much lower temperature than with thermal CVD. An apparatus using photo-assisted CVD is disclosed in, e.g., Jpn. Pat. Appln. KOKAI Publication Nos. 61-183921 and 6-216041. In the apparatuses disclosed in these references, a film formation gas is activated by exciting it with ultraviolet rays or the like, thereby performing film formation.

Figure 7:
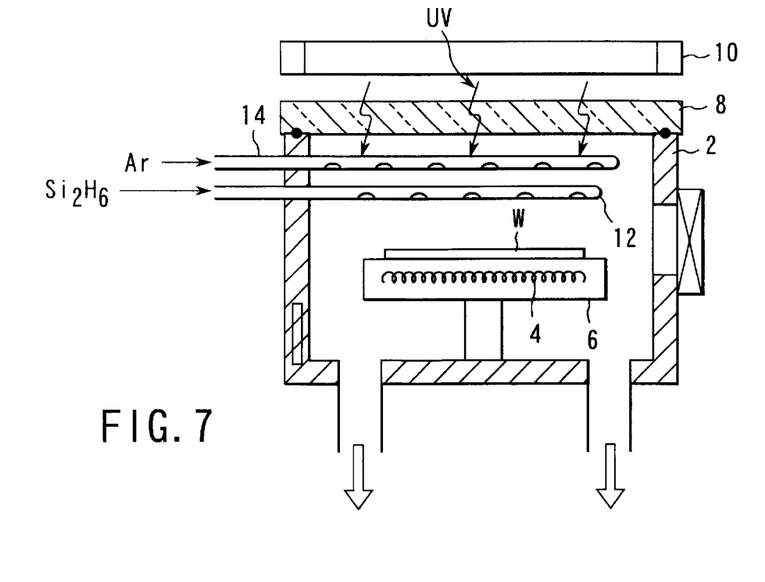
FIG. 7 is a sectional view schematically showing a conventional photo-assisted CVD apparatus.

FIG. 7 is a sectional view schematically showing a conventional photo-assisted CVD apparatus. Referring to FIG. 7, a worktable 6 incorporating a heater 4 is disposed in a process chamber 2 which can be vacuum-evacuated. A target substrate such as a semiconductor wafer W is placed on the upper surface of the worktable 6. A transmission window 8 made of, e.g., quartz, is hermetically disposed in the ceiling of the process chamber 2, and ultraviolet lamps 10 are disposed above the transmission window 8. Ultraviolet rays UV emitted from the ultraviolet lamps 10 are supplied into the process chamber 2 through the transmission window 8. In the process chamber 2, a ring pipe 12 with gas spray holes is disposed above the worktable 6 to supply a process gas (film formation gas). A ring pipe 14 with gas spray holes is disposed between the ring pipe 12 and transmission window 8 in order to supply a purge gas, e.g., an inert gas.

For example, disilane ($Si_2H_6$) is supplied into the process chamber 2 as the process gas, and is activated by being excited by the ultraviolet rays UV. A film formation material obtained by decomposing disilane forms a good-quality amorphous silicon film on the wafer surface. In this case, the film can be formed even if the wafer temperature is much lower (e.g., about 200° C. to 300° C.) than that for thermal CVD. Therefore, various types of thin films formed on the wafer surface in the pre-processes are least damaged thermally.

Since the film is deposited in this manner even when the process temperature is low, a film can be easily deposited also on the inner surface of the transmission window 8. For this reason, an inert gas such as Ar gas is sprayed from the ring pipe 14 to the inner surface of the window 8 to locally purge it of the process gas. This prevents an unwanted film that decreases the light transmittance from attaching to the inner surface of the transmission window 8.

The above photo-assisted CVD apparatus has the following problems. More specifically, an inert gas such as Ar gas is sprayed, as described above, in order to prevent an unwanted film from attaching to the inner surface of the transmission window 8. This spraying must be performed on the entire inner surface of the transmission window 8, and accordingly the amount of inert gas (purge gas) to be used increases very much. As the interior of the process chamber 2 is a vacuum, the flat plate-like transmission window 8 must have a very large thickness so that it has a high pressure resistance. If the transmission window 8 is thick, the quantity of light absorbed by the quartz glass increases accordingly, degrading the light utilization efficiency. A plurality of ultraviolet lamps 10 are disposed parallel to each other in a plane with respect to the transmission window 8. Hence, the arrangement of the ultraviolet lamps 10 is limited, and an arrangement with which the light intensity is further increased and an arrangement with which a better emission efficiency is provided cannot be employed.

The above problems become more and more serious as the wafer size increases from 8 inches to, e.g., 12 inches, and a solution at an early stage is sought for.

BRIEF SUMMARY OF THE INVENTION

It is an object of the present invention to provide a photo-excited gas processing apparatus for a semiconductor process, in which the amount of purge gas to be used is small and the light utilization efficiency is high.

According to a first aspect of the present invention, there is provided a photo-excited gas processing apparatus for a semiconductor process, comprising:

a process chamber configured to accommodate a target substrate;

an excitation chamber connected to the process chamber through a connection path;

a process gas supply system configured to supply a process gas to the process chamber through the excitation chamber, and including a process gas port open to the excitation chamber;

an exhaust system configured to evacuate the process chamber, wherein a flow of the process gas from the process gas port to the connection path is formed in the excitation chamber by the exhaust system evacuating the process chamber;

a window consisting essentially of a light transmission material and disposed in a wall that defines the excitation chamber;

a light source disposed outside the excitation chamber to face the window, and configured to irradiate the flow of the process gas with light through the window, thereby exciting the process gas; and a surface purge system configured to supply a purge gas along an inner surface of the window, and including a purge gas port open to the excitation chamber.

According to a second aspect of the present invention, there is provided a photo-assisted CVD apparatus for a semiconductor process, comprising:

a hermetic process chamber configured to accommodate a target substrate;

a worktable configured to support the target substrate in the process chamber;

a hermetic excitation chamber connected to the process chamber through a connection path;

a process gas supply system configured to supply a process gas to the process chamber through the excitation chamber, and including a process gas port open to the excitation chamber, the process gas being decomposed to provide a material of a film to be formed on the target substrate;

an exhaust system configured to evacuate the process chamber and set the process chamber to vacuum, wherein a flow of the process gas from the process gas port to the connection path is formed in the excitation chamber by the exhaust system evacuating the process chamber;

a window consisting essentially of a light transmission material and disposed in a wall that defines the excitation chamber;

an ultraviolet light source disposed outside the excitation chamber to face the window, and configured to irradiate the flow of the process gas with ultraviolet rays through the window, thereby exciting the process gas; and a surface purge system configured to supply a purge gas along an inner surface of the window, and including a purge gas port open to the excitation chamber.

DETAILED DESCRIPTION OF THE INVENTION

The preferred embodiments of the present invention will be described with reference to the accompanying drawings.

In the following description, constituent components with substantially the same functions and arrangements are denoted by the same reference numerals, and a repetitive description will be made only when it is necessary.

Figure 1:
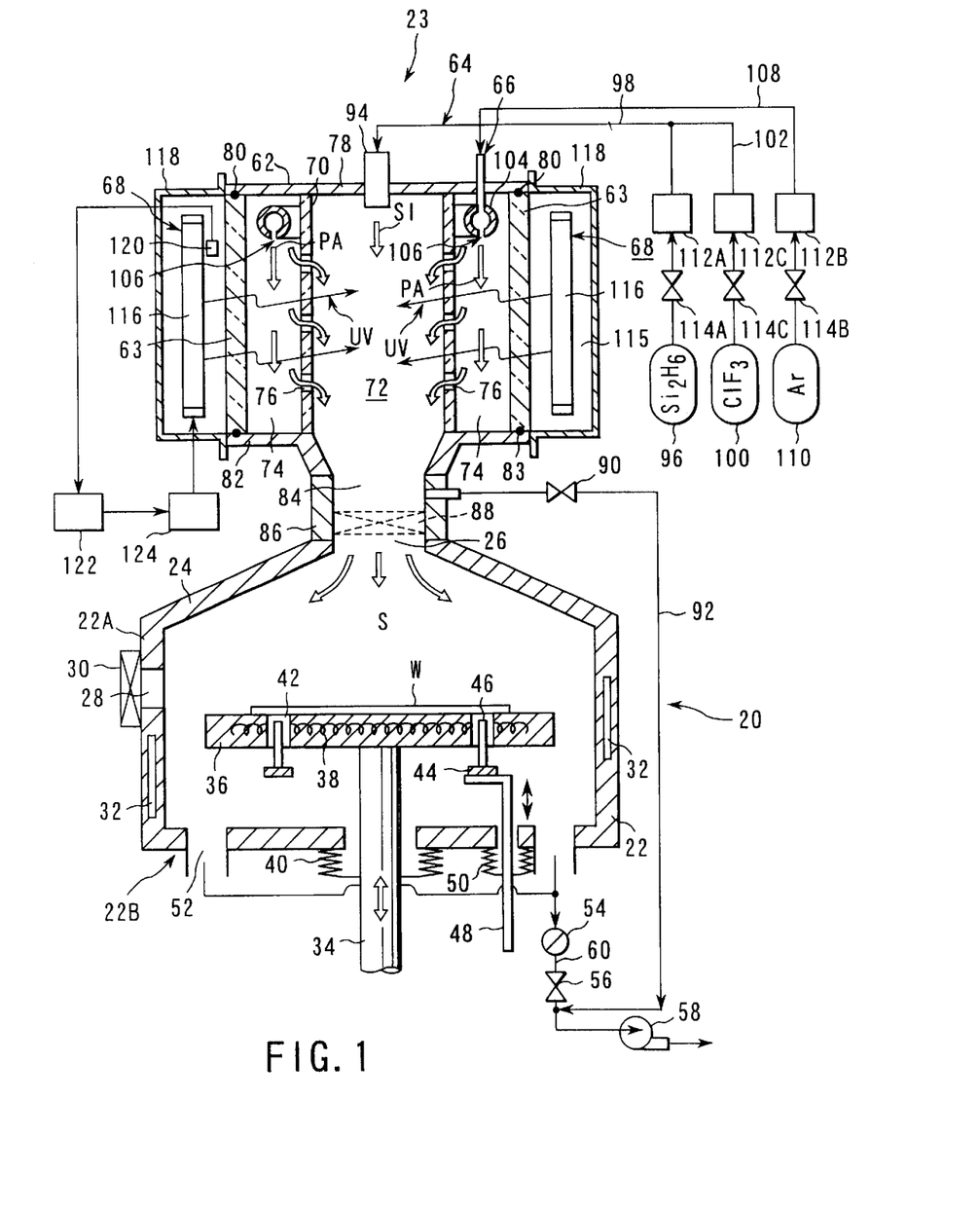
FIG. 1 is a sectional view schematically showing a photo-assisted CVD apparatus according to an embodiment of the present invention.

FIG. 1 is a sectional view schematically showing a single wafer photo-assisted CVD apparatus according to an embodiment of the present invention. As shown in FIG. 1, this apparatus 20 has an aluminum process chamber 22 with an interior having a substantially circular section. An excited gas forming unit 23 for exciting a process gas and supplying it to the process chamber 22 is disposed above the process chamber 22. A ceiling 24 of the process chamber 22 has, at its center, a gas port 26 connected to the excited gas forming unit 23. The ceiling 24 has a flared shape, e.g., a conical shape, about the gas port 26 as the center, and lets the excited gas flow toward a process space S from the gas port 26. Alternatively, a showerhead structure may be used to supply the excited gas.

A wafer port 28 for loading/unloading a semiconductor wafer W as a target substrate in/from the process chamber 22 is disposed in a sidewall 22A of the process chamber 22. A hermetically openable/closeable gate valve 30 is disposed in the wafer port 28. A temperature-controlled jacket 32 which is temperature-controlled by a temperature control medium is also disposed in the sidewall 22A of the process chamber 22.

For example, a cylindrical column 34 is disposed in the process chamber 22 to extend through a bottom 22B, and a circular disk-like worktable 36 is fixed to the upper end of the column 34. The worktable 36 has, as a heating means in it, a resistance heater 38 arranged with a predetermined pattern. The outer side of the heater 38 is made of a sintered ceramic material such as AlN. The semiconductor wafer W as the target substrate is placed on the upper surface of the worktable 36. The resistance heater 38 is connected to a feeder (not shown) disposed in the column 34, so a controlled power is supplied to it. A temperature-sensing element (not shown) such as a thermocouple is disposed in the worktable 36 to control the temperature of the heater 38. A bellows 40 made of a metal is hermetically disposed at that portion of the process chamber 22 where the column 34 extends through the bottom 22B of the process chamber 22. The worktable 36 can be vertically moved while the interior of the process chamber 22 is hermetically maintained by the bellows 40.

The worktable 36 has a plurality of lifter holes 42 extending in the vertical direction. The respective lifter holes 42 loosely accommodate lifter pins 46 which are made of, e.g., quartz, and which have lower ends commonly connected to a connection ring 44. The connection ring 44 is connected to an air cylinder or the like (not shown) through an operation rod 48 extending through the bottom 22B. When the wafer W is to be transferred, the respective lifter pins 46 are driven to project from or withdraw into the upper ends of the corresponding lifter holes 42. A bellows 50 is disposed at that portion of the process chamber 22 where the operation rod 48 extends through the bottom 22B. The operation rod 48 can be vertically moved while the airtightness in the process chamber 22 is maintained by the bellows 50.

A vacuum exhaust port 52 is formed in the periphery of the bottom 22B. The vacuum exhaust port 52 is connected to an exhaust line 60 to which a pressure adjustment valve 54, exhaust valve 56, and vacuum pump 58 are sequentially disposed. These members 54 to 58 can evacuate the process chamber 22 and set the interior of the process chamber 22 to a predetermined vacuum pressure.

Figure 2:
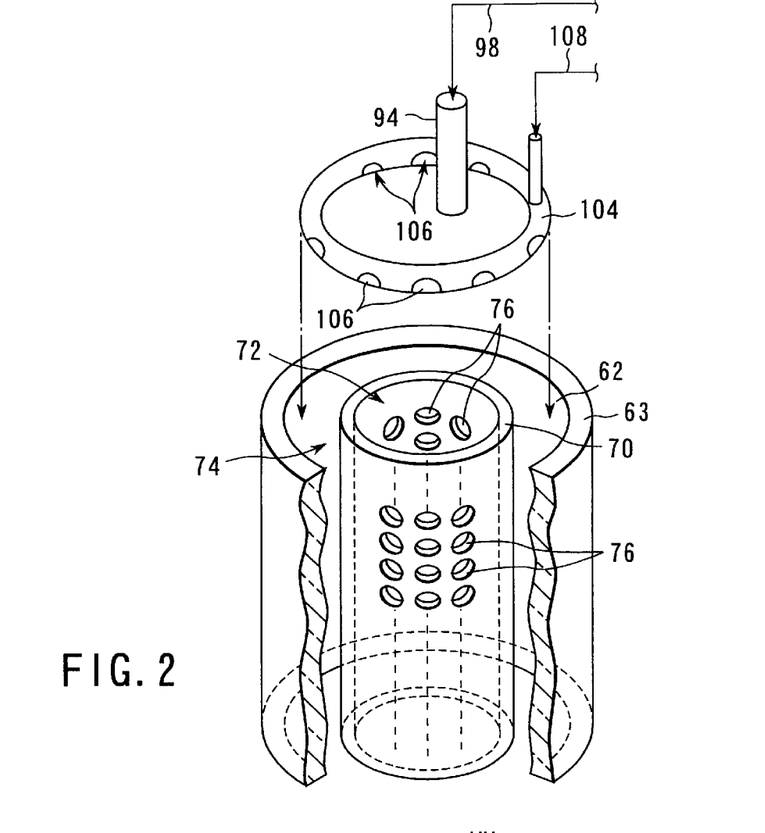
FIG. 2 is a perspective view showing the interior of an excitation chamber in the apparatus shown in FIG. 1.
Figure 3:
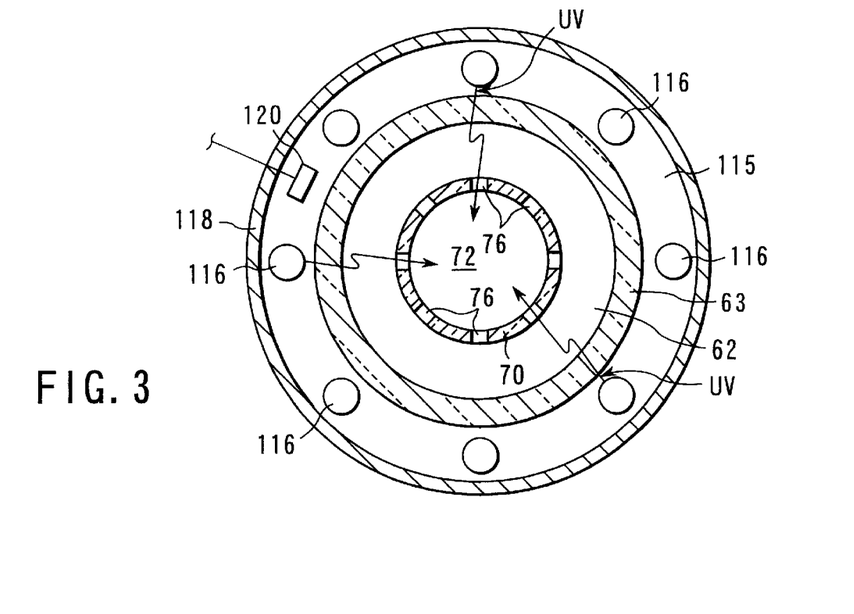
FIG. 3 is a cross-sectional plan view showing the relationship between the excitation chamber and a lamp chamber around it in the apparatus shown in FIG. 1.

The excited gas forming unit 23 includes a cylindrical excitation chamber 62. The excitation chamber 62 is connected to a process gas supply system 64 for supplying the process gas, and a surface purge system 66 for supplying a purge gas along the inner surface of the excitation chamber 62. A light radiation mechanism 68 including a lamp chamber 115 is disposed around the excitation chamber 62. FIG. 2 is a perspective view showing the interior of the excitation chamber 62. FIG. 3 is a cross-sectional plan view showing the relationship between the excitation chamber 62 and the lamp chamber 115 around it.

The excitation chamber 62 has a cylindrical sidewall 63 made of a light transmission material, e.g., quartz glass, or a light transmission window. A cylindrical thin partition 70 made of a light transmission material, e.g., quartz glass, is concentrically disposed inside the cylindrical sidewall 63. The space inside the partition 70 serves as a core space 72 where mainly the process gas flows and is excited, and the space formed between the partition 70 and cylindrical sidewall (window) 63 serves as a surrounding space 74 where the purge gas flows. Since the window 63 is cylindrical, its mechanical strength (pressure resistance) is higher than that of a flat plate-like window. Hence, the window 63 is thinner than a flat plate-like window. The inner diameters of the excitation chamber 62 and partition 70 are about 100 mm and 50 mm, respectively, and their heights are about 100 mm to 700 mm.

The partition 70 has, in its entire surface, a large number of gas flow holes 76 each with a diameter of about 0.2 mm to several mm. The purge gas flows into the core space 72 from the outer surrounding space 74 through the gas flow holes 76, as will be described later. A ceiling plate 78 made of, e.g., aluminum, is hermetically attached to the top of the excitation chamber 62 through a seal member 80 such as an O-ring. A bottom plate 82 made of, e.g., aluminum, is hermetically disposed in the bottom of the excitation chamber 62 through a seal member 83 such as an O-ring. The bottom of the surrounding space 74 is sealed by the bottom plate 82, while the bottom of the core space 72 is bent downward and opened to form a port 84.

The port 84 of the excitation chamber 62 and the gas port 26 of the ceiling 24 of the process chamber 22 which is located below the port 84 are connected to each other through a short connection pipe 86. A valve 88 for connecting/disconnecting the two chambers 62 and 22 to/from each other is disposed in the connection pipe 86. A bypass line 92 with a valve 90 is disposed to connect the connection pipe 86 and that portion of the exhaust line 60 which is downstream the valve 56.

When necessary, the atmosphere in the excitation chamber 62 is evacuated by the bypass line 92 to bypass the process chamber 22.

The process gas supply system 64 has a process gas nozzle (port) 94 which is formed in the ceiling plate 78 and opens to the core space 72. The nozzle 94 is connected to a process gas source 96 through a line 98. As the process gas, a gas, e.g., disilane ($Si_2H_6$), that provides a film formation material by decomposition is used. The line 98 is connected to a source 100 of a cleaning gas, e.g., $ClF_3$, through a branch line 102.

The surface purge system 66 has a circular ring pipe 104 at the upper end of the interior of the surrounding space 74. The ring pipe 104 has a large number of gas spray holes (ports) 106 in its lower surface along its circumferential direction. The ring pipe 104 is connected to a source 110 of the purge gas through a line 108. As the purge gas, for example, Ar is used. Alternatively, He, $N_2$, $H_2$, or the like may be used instead.

Massflow controllers 112A, 112B, and 112C and valves 114A, 114B, and 114C for controlling the gas flow rates are disposed in the lines 98, 108, and 102, respectively.

The lamp chamber 115 is disposed to surround the excitation chamber 62, and a plurality of, e.g., 8, ultraviolet (UV) lamps 116 are disposed in the lamp chamber 115 in the vertical direction. The UV lamps 116 are arranged substantially equidistantly, as shown in FIG. 3, so as to radiate the ultraviolet rays UV toward the center of the excitation chamber 62. The number of UV lamps 116 is not limited to 8, but may be changed when necessary. A cylindrical reflection plate 118 made of, e.g., stainless steel, is set to cover the outer sides of the UV lamps 116. The ultraviolet rays UV emitted from the respective UV lamps 116 are reflected by the reflection plate 118 toward the center, thereby improving the light utilization efficiency.

In the lamp chamber 115, a light quantity sensor 120 is disposed between the two UV lamps 116. The sensor 120 measures the light quantity of ultraviolet rays UV transmitted from the opposite side through the window 63 and partition 70. The detection value of the sensor 120 is input to a light quantity controller 122 comprised of, e.g., a microcomputer. On the basis of the detection value, the controller 122 controls an output from a power supply 124 for the UV lamps 116 to be an optimal value.

A process performed by the photo-assisted CVD apparatus 20 shown in FIG. 1 will be described. In this case, CVD is performed to deposit a silicon film on the semiconductor wafer W, and subsequently the interior of the process chamber 22 is cleaned.

First, a non-processed semiconductor wafer W is held by a transfer arm (not shown) and is loaded in the process chamber 22 through the gate valve 30 and wafer port 28. The wafer W is transferred to the lifter pins 46 which have been moved upward. As the lifter pins 46 move downward, the wafer W is placed on the worktable 36 which is maintained at a predetermined temperature in advance. On the worktable 36, the temperature of the wafer W is increased to and maintained at a process temperature, e.g., about 200° C. to 300° C.

The interior of the process chamber 22 is vacuum-evacuated and maintained at a predetermined pressure, e.g., about 100 Pa. At this time, the valve 88 disposed in the communication pipe 86 is opened, so the chambers 62 and 22 communicate with each other. The film formation process gas excited in the excitation chamber 62 flows into the process space S in the process chamber 22 through the communication pipe 86. The process gas is diffused and decomposed in the process space S in order to provide a film formation material, so a silicon film is formed on the wafer W.

How the process gas is excited in the excited gas forming unit 23 will be described in detail.

Flow rate-controlled disilane SI is supplied into the core space 72 from the process gas nozzle 94 of the process gas supply system 64. Flow rate-controlled argon gas PA is supplied into the surrounding space 74 from the ring pipe 104 of the surface purge system 66. The flow rates are respectively set to be about 100 sccm for disilane and about 1,000 sccm for argon gas. The flow rates are controlled such that the surrounding space 74 is slightly at a positive pressure with respect to the core space 72.

Simultaneously, the UV lamps 116 radiate the ultraviolet rays UV as the excitation light toward the center of the excitation chamber 62. Disilane flowing down in the core space 72 is gradually excited and activated upon being irradiated with the ultraviolet rays UV. When the activated film formation gas comes into contact with a wall surface, an unwanted film (silicon film) tends to attach it. In the apparatus shown in FIG. 1, however, since the purge gas is supplied in the above manner, an unwanted film can be suppressed from attaching to the inner surface of the window 63 or the inner surface of the partition 70 as much as possible. Namely, the purge gas is sprayed downward from the respective gas spray holes 106 of the ring pipe 104. The purge gas flows along the inner surface of the excitation chamber 62, and acts to form a purge gas curtain there. Therefore, the excited process gas is prevented from coming into contact with the inner surface of the window 63.

Since the surrounding space 74 is at a positive pressure with respect to the core space 72, the purge gas PA flows into the core space 72 through the holes 76 in the partition 70. The flowed purge gas PA flows down along the inner surface of the partition 70, and acts to form a purge gas curtain there, in the same manner as described above. Therefore, the excited process gas is prevented from coming into contact with the inner surface of the partition 70. Since the purge gas also flows along the outer surface of the partition 70, no unwanted film attaches there. Thus, the radiation efficiency of the excitation light can be increased.

The excited process gas supplied to the process space S flows downward from the gas port 26 located at the top of the conical ceiling 24 while it is diffused to form a flared shape toward the periphery. Hence, the planar uniformity of the process gas concentration on the wafer W can be increased.

Figure 4A:
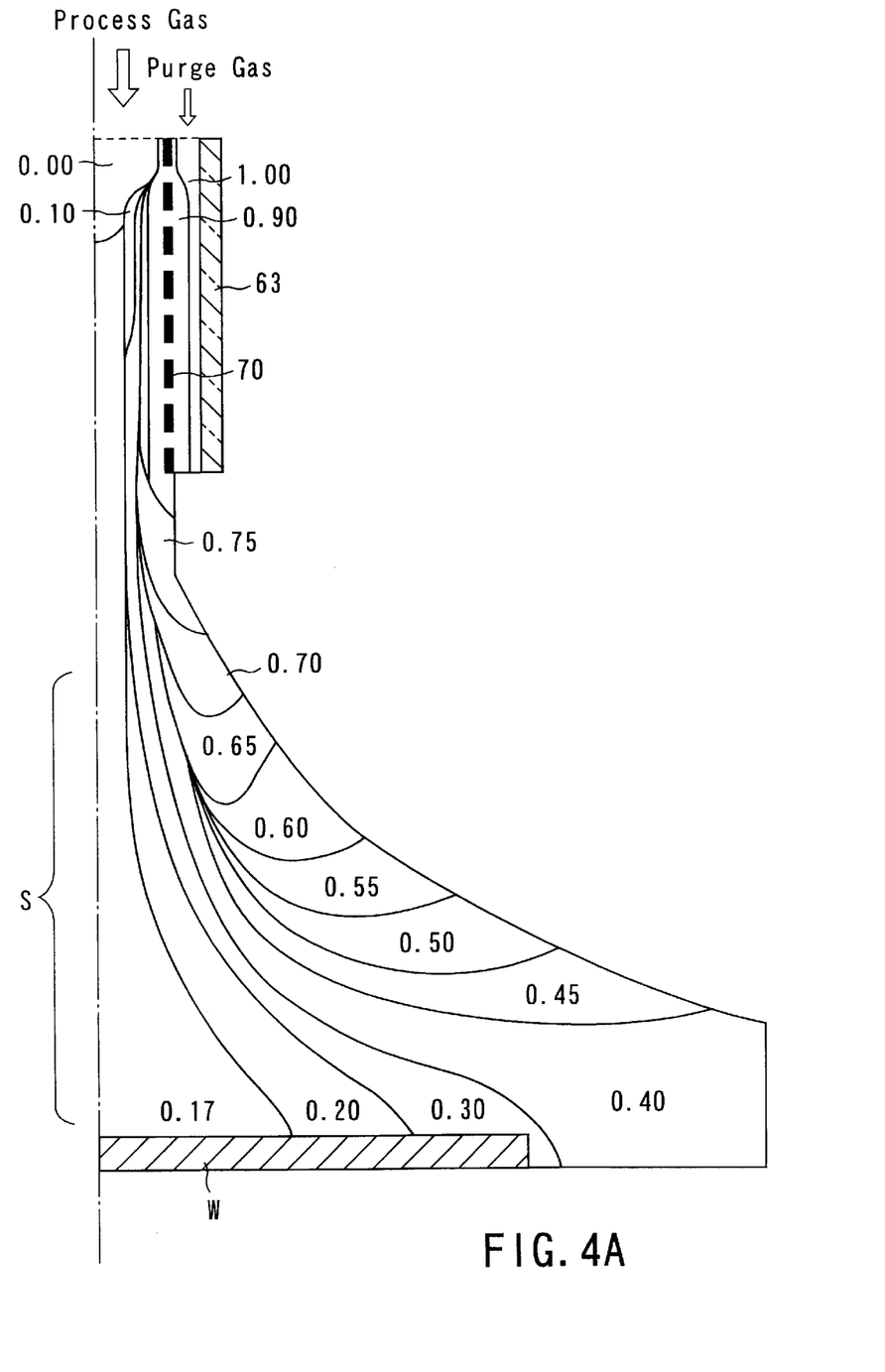
FIGS. 4A and 4B are graphs showing the simulation results of the concentration profiles of purge gases in the apparatuses shown in FIGS. 1 and 5, respectively.

FIG. 4A is a graph showing the simulation result of the concentration profile of the purge gas in the apparatus shown in FIG. 1. FIG. 4A shows half sections of the excitation chamber 62 and process chamber 22. The respective numerals in the concentration profile are relative concentrations of the purge gas with respect to the process gas. Namely, purge gas concentration 100% corresponds to a value "1". Accordingly, the larger the concentration, the larger the amount of purge gas at the corresponding portion; the smaller the concentration, the larger the amount of process gas at the corresponding portion.

As shown in FIG. 4A, a purge gas with a high concentration, e.g., about "1.00" concentration, flows along the inner surface of the window 63. A purge gas with a high concentration, e.g., about "0.9" concentration, also flows along the inner and outer surfaces of the partition 70. Thus, on the inner surface of the partition 70 as well, entry of the process gas is effectively prevented by the purge gas.

In contrast to this, the concentration of the purge gas in the process space S above the wafer W falls within a very small range of about "0.17 to 0.30". In other words, since the concentration of the process gas falls within a small range of about "0.83 to 0.70", the planar uniformity of the concentration of the process gas can be maintained at a comparatively high value. The concentration profile of the process gas changes depending on the process conditions. When the worktable 36 is vertically moved to adjust its height, the wafer W can be positioned at a place with an optimal concentration profile.

In the apparatus shown in FIG. 1, the purge gas is caused to flow downward from the ring pipe 104 so it forms a so-called purge gas curtain. Therefore, the amount of purge gas necessary in this apparatus is considerably smaller than that of a case wherein the purge gas is sprayed to the entire inner surface of the flat plate-like transmission window 8 in a plane as in the conventional apparatus shown in FIG. 7. More specifically, in the apparatus shown in FIG. 1, the amount of purge gas to be used can be greatly reduced when compared to the prior art, and the running costs can be reduced accordingly. The lower end of the surrounding space 74 is sealed by the bottom plate 82, and the purge gas supplied to the surrounding space 74 finally flows entirely into the core space 72 through the holes 76. This arrangement also contributes to reliable formation of the purge gas curtain.

Since the window 63 is formed cylindrical, its pressure resistance can be higher than that of the flat plate-like transmission window 8 of the conventional apparatus, and the thickness of the window 63 can be decreased accordingly. Since the thickness of the window 63 can be decreased, the quantity of ultraviolet rays UV absorbed by the quartz glass of window 63 can be suppressed, and the light utilization efficiency can be further increased. Since the window 63 is formed cylindrical, a larger number of UV lamps 116 can be arranged around it when necessary, so they can radiate the ultraviolet rays UV from its entire circumferential direction toward the center of the excitation chamber 62. Therefore, different from a case wherein the transmission window 8 is formed into a flat plate-like shape as in the conventional apparatus, more intense ultraviolet rays UV can be radiated.

The process temperature is set to about 200° C. to 300° C., as described above. A coolant such as a chiller is supplied to the temperature adjustment jacket 32 formed in the sidewall of the process chamber 22, and the temperature of the coolant is maintained at a value, e.g., about 15° C., which is smaller than the process temperature. As a result, an unwanted film attaching to the sidewall of the process chamber 22 can be minimized as much as possible.

As the lot process of the wafer w is repeated, unwanted films attach, although gradually, to the inner surface of the excitation chamber 62 and both the inner and outer surfaces of the partition 70, and the quantity of transmission light of the ultraviolet rays UV inevitably decreases gradually. In the apparatus shown in FIG. 1, the sensor 120 is disposed outside the window 63, so the light quantity of the ultraviolet rays UV transmitted through the window 63 is constantly detected. The lamp power supply 124 is controlled by the controller 122 such that this detection value is always constant. As a result, the process gas can be excited with a constantly stable light quantity.

As unwanted films attach to the window 63 and partition 70, the transmitted light quantity decreases. In order to compensate for this, the output power from the lamp power supply 124 increases. However, when the output power increases to a predetermined value or more, it is determined that unwanted films exceeding a limit amount have attached, and a cleaning process for removing the unwanted films is performed. When the cleaning process is to be performed, supply of the process gas and purge gas is stopped, and a cleaning gas ($ClF_3$) is supplied instead under flow rate control. The cleaning gas removes particularly unwanted silicon films attaching to the inner and outer surfaces of the partition 70.

When not only the interior of the excitation chamber 62 but also the interior of the process chamber 22 is to be cleaned, the cleaning gas is supplied from the process gas nozzle 94 to the excitation chamber 62, and any unwanted film in the excitation chamber 62 is removed. The cleaning gas further flows downward into the process chamber 22, to remove unwanted films attaching to the surface of the worktable 36 and the inner surface of the process chamber 22.

In contrast to this, sometimes the interior of the process chamber 22 need not be cleaned but only the interior of the excitation chamber 62 need be cleaned. In this case, first, the valve 88 provided to the communication pipe 86 is closed, thereby disconnecting the two chambers 62 and 22 from each other. Furthermore, the exhaust valve 56 disposed in the exhaust line 60 of the process chamber 22 is also closed to isolate the interior of the process chamber 22. Then, the valve 90 disposed in the bypass line 92 is opened, so only the interior of the excitation chamber 62 can be vacuum-evacuated.

In this state, the cleaning gas is supplied from the process gas nozzle 94, as described above, to remove unwanted films in the excitation chamber 62. The cleaning gas is vacuum-exhausted directly to the exhaust line 60 through the bypass line 92 without flowing into the process chamber 22.

The cleaning gas is supplied from only the process gas nozzle 94. Alternatively, the cleaning gas may be supplied from the ring pipe 104 as well. As the cleaning gas, $ClF_3$ gas is used. Alternatively, another cleaning gas corresponding to the film type, e.g., $NF_3$ gas, may be used as another fluorine-based gas.

Figure 5:
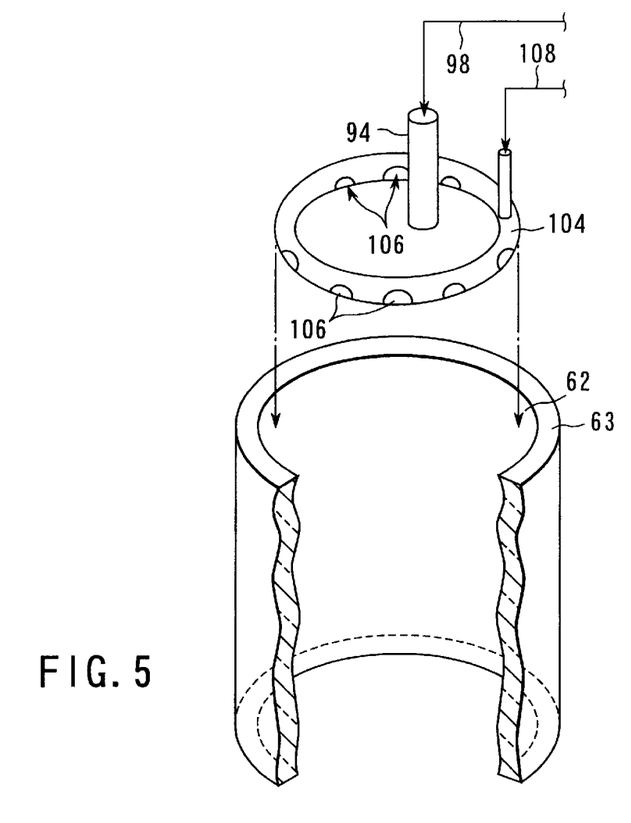
FIG. 5 is a perspective view showing the interior of an excitation chamber in a photo-assisted CVD apparatus according to another embodiment of the present invention.

FIG. 5 is a perspective view showing the interior of the excitation chamber of a photo-assisted CVD apparatus according to another embodiment of the present invention. In the apparatus of this embodiment, no partition 70 is present in an excitation chamber 62, so the excitation chamber 62 is not divided into a core space 72 and surrounding space 74. In the apparatus of this embodiment, other arrangements such as a process chamber 22 and excited gas forming unit 23 are identical to those of the apparatus shown in FIG. 1.

In the excitation chamber 62 shown in FIG. 5, a purge gas supplied from a ring pipe 104 tends to be slightly diffused toward the center of the excitation chamber 62 because the excitation chamber 62 is not partitioned by the partition 70. Still, the purge gas flows along the inner surface of a window 63, so that a purge gas curtain can be formed at this portion. Therefore, a process gas can be prevented from coming into contact with the inner surface of the window 63, so an unwanted film does not attach to it. The supply amount of the purge gas can be decreased. Also, the pressure resistance of the window 63 can be improved. Thus, the thickness of the window 63 can be decreased. In particular, in this embodiment, since no partition 70 made of quartz glass is provided, the light utilization efficiency is increased by the light quantity of the ultraviolet rays UV that have been absorbed by the partition 70.

Figure 4B:
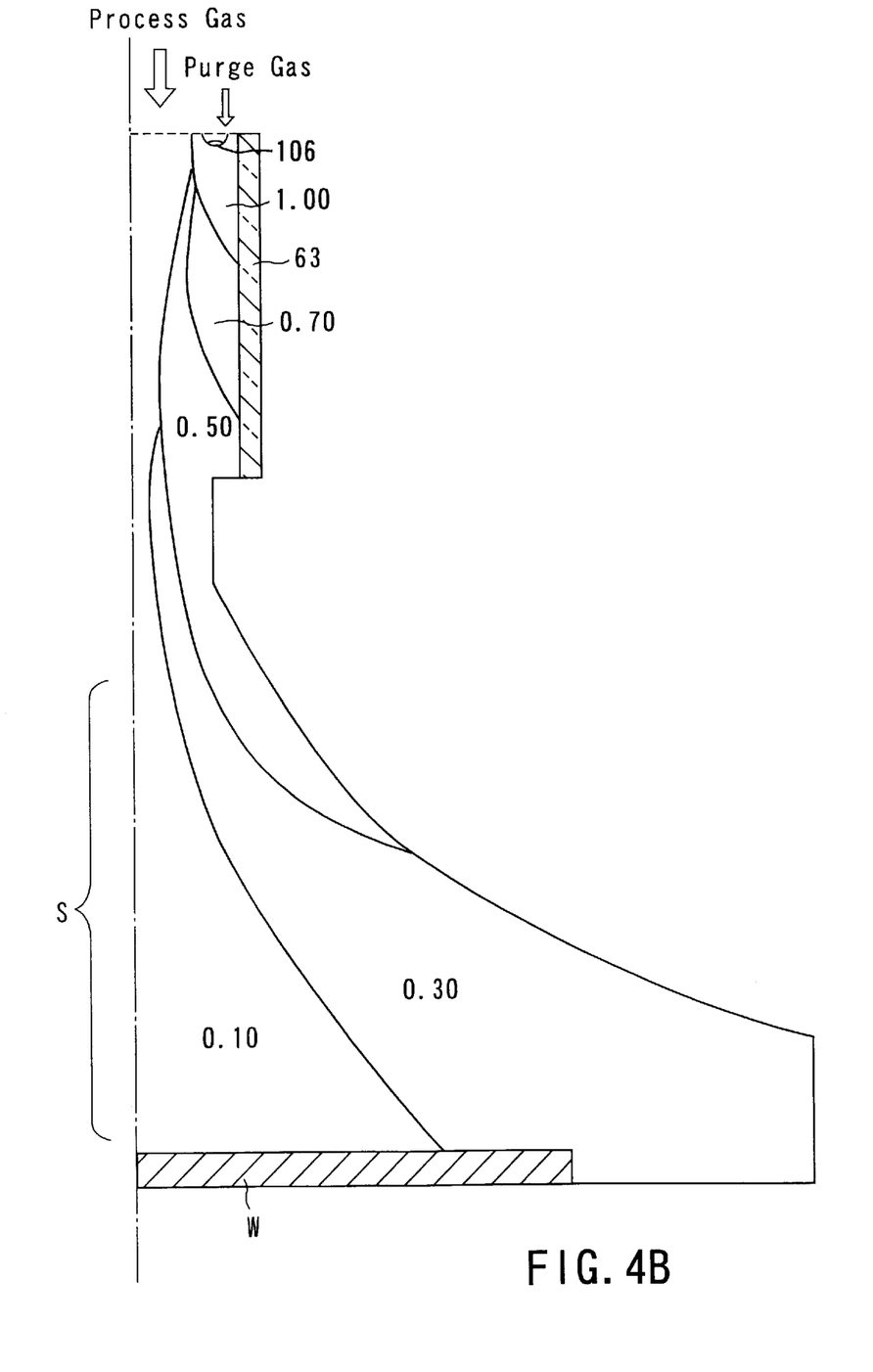

FIG. 4B is a graph showing the simulation result of the concentration profile of the purge gas in the apparatus that employs the excitation chamber shown in FIG. 5. Similarly to FIG. 4A, the respective numerals in the concentration profile are relative concentrations of the purge gas with respect to the process gas. Namely, purge gas concentration 100% corresponds to value "1".

As shown in FIG. 4B, the concentration of the purge gas along the inner surface of the window 63 is as high as "0.70 to 1.00" at the upper portion in the vicinity of the gas spray holes 106 and is slightly low as "0.50 to 0.70" at the lower portion in the vicinity of the gas spray holes 106. However, on the inner surface of the window 63, entry of the process gas is effectively prevented by the purge gas. Meanwhile, the concentration of the purge gas on a process space S side is about "0.10 to 0.30", which is a low concentration falling within a narrow range.

Figure 6:
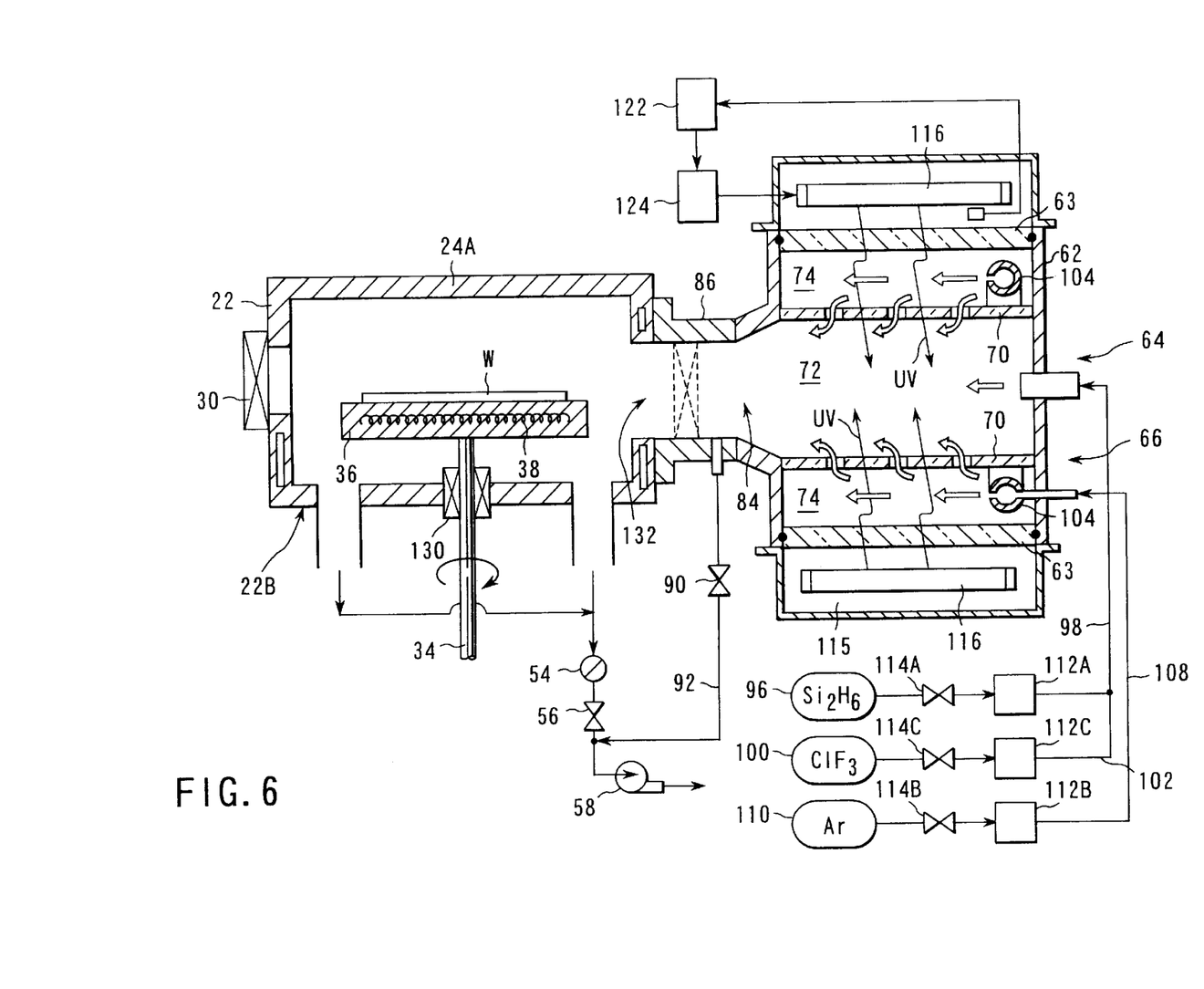
FIG. 6 is a sectional view schematically showing a photo-assisted CVD apparatus according to still another embodiment of the present invention.

FIG. 6 is a sectional view schematically showing a photo-assisted CVD apparatus according to still another embodiment of the present invention. In the apparatus of this embodiment, an excited gas forming unit 23 is disposed not above but beside a process chamber 22. In the apparatus of this embodiment, the basic arrangements of the process chamber 22 and excited gas forming unit 23 are identical to those of the apparatus shown in FIG. 1.

In the apparatus shown in FIG. 6, a gas port 132 is formed in the sidewall of the process chamber 22. The gas port 132 is connected to a port 84 of a horizontal excited gas forming unit 23 (substantially identical to that shown in FIG. 1) through a connection pipe 86. A ceiling 24A of the process chamber 22 is flat as it need not form a sector shape. Since the process gas flows from one side, i.e., from the gas port 132 formed in the sidewall of the process chamber 22, a worktable 36 is rotatable. When the worktable 36 is rotated during the process, the planar uniformity of the process for a semiconductor wafer W is assured. A column 34 for supporting the worktable 36 is supported at a bottom 22B of the process chamber 22 through, e.g., a magnetic fluid seal 130, to maintain the airtightness of the process chamber 22.

With the apparatus shown in FIG. 6, the same function as that of the apparatus shown in FIG. 1 can be obtained.

In the above embodiments, disilane is used as a process gas for forming a silicon film. Alternatively, monosilane ($SiH_4$) may be used instead. The present invention is not limited to deposition of a silicon film, but can be applied to a CVD apparatus for depositing various types of oxide films, nitride films, metal films, or the like. The present invention can also be applied to an etching apparatus for etching a film. As the process gas, for example, $Al(CH_3)_3$, $Cd(CH_3)_2$, $Zn(CH_3)_2$, $Sn(CH_3)_4$, $Ga(CH_3)_3$, $B(CH_3)_3$, $Si(CH_3)_4$, $Ge(CH_3)_4$, $Cr(CO)_6$, $Mo(CO)_6$, $W(CO)_6$, $NO_2$, $SiH_4$, $NH_4$, $C_2$, $H_2$, or the like can be used.

In the above embodiments, the UV lamps 116 are used as the light radiation mechanism 68. Alternatively, an ultraviolet laser source may be used instead. Furthermore, the target substrate is not limited to a semiconductor wafer, but the present invention can also be applied to processing of another substrate such as a glass substrate or LCD substrate.

What is claimed is:

1. A photo-excited gas processing apparatus for a semiconductor process, comprising:

a process chamber configured to accommodate a target substrate;

an excitation chamber connected to the process chamber through a connection path;

a process gas supply system configured to supply a process gas to the process chamber through the excitation chamber, and including a process gas port open to the excitation chamber;

an exhaust system configured to evacuate the process chamber, wherein a flow of the process gas from the process gas port to the connection path is formed in the excitation chamber by the exhaust system evacuating the process chamber;

a window including essentially of a light transmission material and disposed in a wall that defines the excitation chamber;

a light source disposed outside the excitation chamber to face the window, and configured to irradiate the flow of the process gas with light through the window, thereby exciting the process gas; and a surface purge system configured to supply a purge gas along an inner surface of the window, and including a purge gas port open to the excitation chamber.

2. The apparatus according to claim 1, wherein the excitation chamber has a cylindrical shape and comprises a cylindrical sidewall serving as the window.

3. The apparatus according to claim 2, wherein the process gas port is open to one end of the cylindrical shape of the excitation chamber and the connection path is open to the other end of the cylindrical shape of the excitation chamber.

4. The apparatus according to claim 3, wherein the purge gas port comprises a plurality of gas supply ports, arranged along the inner surface of the window, at one end of the cylindrical shape of the excitation chamber.

5. The apparatus according to claim 4, wherein the plurality of gas supply holes are lined up in a circle about the process gas port as a center.

6. The apparatus according to claim 1, wherein the light source comprises an ultraviolet light source.

7. The apparatus according to claim 1, further comprising a sensor configured to measure a quantity of light generated by the light source and transmitted through the window, and a light quantity controller configured to control an output of the light source on the basis of a measurement value obtained from the sensor.

8. The apparatus according to claim 1, further comprising a valve configured to open/close the connection path, and a bypass line which selectively bypasses the process chamber to directly connect the excitation chamber and the exhaust system to each other.

9. The apparatus according to claim 1, wherein the excitation chamber is arranged above the process chamber.

10. The apparatus according to claim 9, wherein the connection path is open to a center of a ceiling of the process chamber, and the ceiling has a flared shape about the connection path as a center.

11. The apparatus according to claim 9, further comprising a vertically movable worktable configured to support the target substrate in the process chamber.

12. The apparatus according to claim 1, wherein the excitation chamber is arranged beside the process chamber.

13. The apparatus according to claim 1, wherein the apparatus further comprises a partition, which partitions the excitation chamber into first and second spaces, includes light transmission material, and has a plurality of gas flow holes, the process gas port is open to the first space and directly communicates with the connection path through the first space, and the purge gas port is open to the second space and communicates with the connection path through the second space, the gas flow holes in the partition, and the first space.

14. The apparatus according to claim 13, wherein the excitation chamber has a cylindrical shape and comprises a cylindrical sidewall serving as the window.

15. The apparatus according to claim 14, wherein the partition has a cylindrical shape and the second space concentrically surrounds the first space.

16. The apparatus according to claim 13, wherein the second space is set at a positive pressure with respect to the first space.

17. A photo-assisted CVD apparatus for a semiconductor process, comprising:

a hermetic process chamber configured to accommodate a target substrate;

a worktable configured to support the target substrate in the process chamber;

a hermetic excitation chamber connected to the process chamber through a connection path;

a process gas supply system configured to supply a process gas to the process chamber through the excitation chamber, and including a process gas port open to the excitation chamber, the process gas being decomposed to provide a material of a film to be formed on the target substrate;

an exhaust system configured to evacuate the process chamber and set the process chamber to vacuum, wherein a flow of the process gas from the process gas port to the connection path is formed in the excitation chamber by the exhaust system evacuating the process chamber;

a window consisting essentially of a light transmission material and disposed in a wall that defines the excitation chamber;

an ultraviolet light source disposed outside the excitation chamber to face the window, and configured to irradiate the flow of the process gas with ultraviolet rays through the window, thereby exciting the process gas; and a surface purge system configured to supply a purge gas along an inner surface of the window, and including a purge gas port open to the excitation chamber.

18. The apparatus according to claim 17, wherein the apparatus further comprises a partition, which partitions the excitation chamber into first and second spaces, include light transmission material, and has a plurality of gas flow holes, the process gas port is open to the first space and directly communicates with the connection path through the first space, and the purge gas port is open to the second space and communicates with the connection path through the second space, the gas flow holes in the partition, and the first space.

19. The apparatus according to claim 18, wherein the excitation chamber has a cylindrical shape and comprises a cylindrical sidewall serving as the window, the partition has a cylindrical shape and the second space concentrically surrounds the first space, and the process gas port is open to one end of the cylindrical shape of the excitation chamber and the connection path is open to the other end of the cylindrical shape of the excitation chamber.

20. The apparatus according to claim 18, wherein the second space is set at a positive pressure with respect to the first space.

* * * * *